United States Patent [19]

Wilcox

[11] Patent Number: 4,642,489
[45] Date of Patent: Feb. 10, 1987

[54] SAMPLED DATA AMPLITUDE LINEAR PHASE DETECTOR

[75] Inventor: Milton E. Wilcox, Saratoga, Calif.

[73] Assignee: National Semiconductor Corporation, Santa Clara, Calif.

[21] Appl. No.: 657,328

[22] Filed: Oct. 3, 1984

[51] Int. Cl.⁴ .................. H03K 5/26; H03K 5/159; H03K 5/00
[52] U.S. Cl. .................. 307/514; 307/352; 307/262; 328/133; 328/155; 328/26
[58] Field of Search ............ 307/514, 510, 352, 353, 307/261, 494, 497, 498, 262; 328/26, 133, 155, 151; 330/253, 9

[56] References Cited

U.S. PATENT DOCUMENTS

| | | | |
|---|---|---|---|
| 4,109,308 | 8/1978 | Rödel | 328/26 |
| 4,297,642 | 10/1981 | Baldwin et al. | 330/9 |
| 4,329,599 | 5/1982 | Gregorian et al. | 307/497 |
| 4,355,285 | 10/1982 | Kelley et al. | 330/9 |
| 4,439,693 | 3/1984 | Lucas et al. | 307/353 |
| 4,453,130 | 6/1984 | Bennett | 328/127 |
| 4,521,743 | 6/1985 | Heimer | 330/9 |

Primary Examiner—John S. Heyman
Assistant Examiner—Timothy P. Callahan
Attorney, Agent, or Firm—Gail W. Woodward; Paul J. Winters

[57] ABSTRACT

A sampled data phase detector is created using a differential amplifier that is provided with a feedback capacitor connected between the output and the inverting input. A reference potential is coupled to the noninverting input. A coupling capacitor is connected between the inverting input and a sampling switch that switches the coupling capacitor alternately between ground and a circuit input terminal. A second switch alternately shorts out the feedback capacitor at the clock rate during the time interval the input capacitor is grounded. In this state both inputs and the output are forced to the reference potential. On the other half of the clock cycle the amplifier input is coupled to sense the data signal. The result is a rectified version of the data signal appearing at the amplifier output. The d-c level of this signal is related to the amplitude and phase of the data signal. A full wave version of the circuit is also disclosed.

4 Claims, 4 Drawing Figures

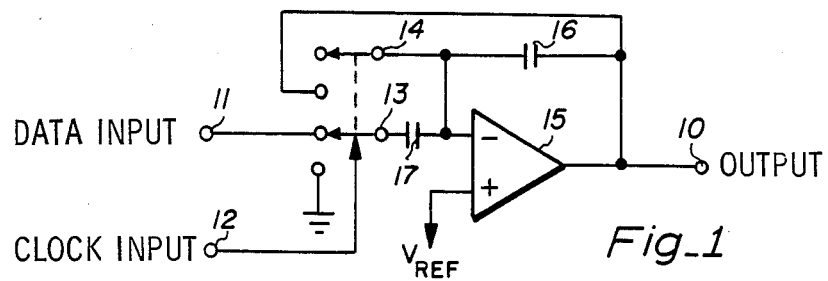
Fig_1
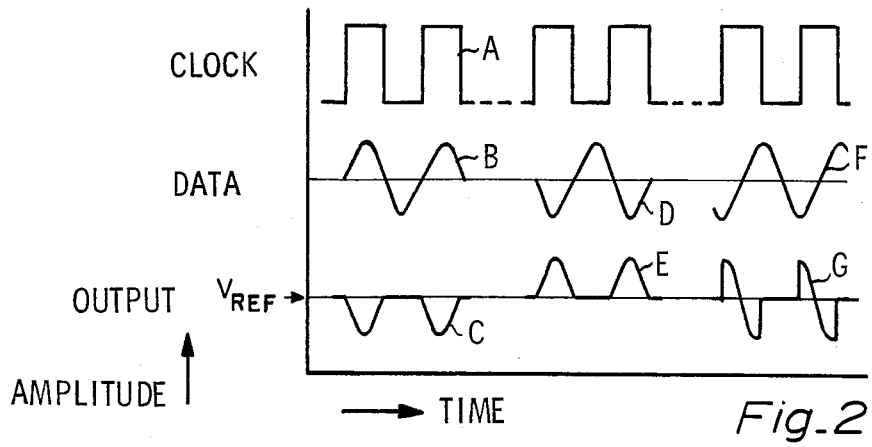
Fig_2
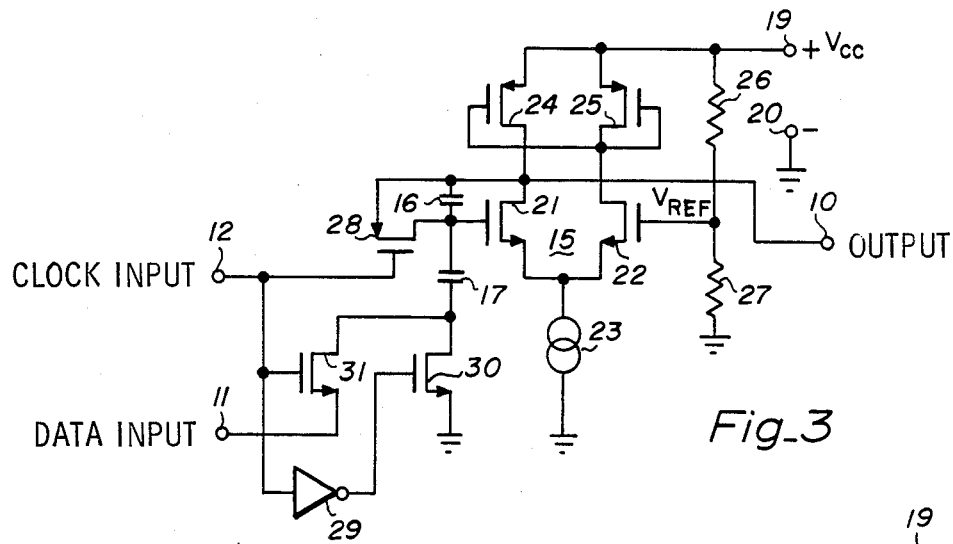
Fig_3
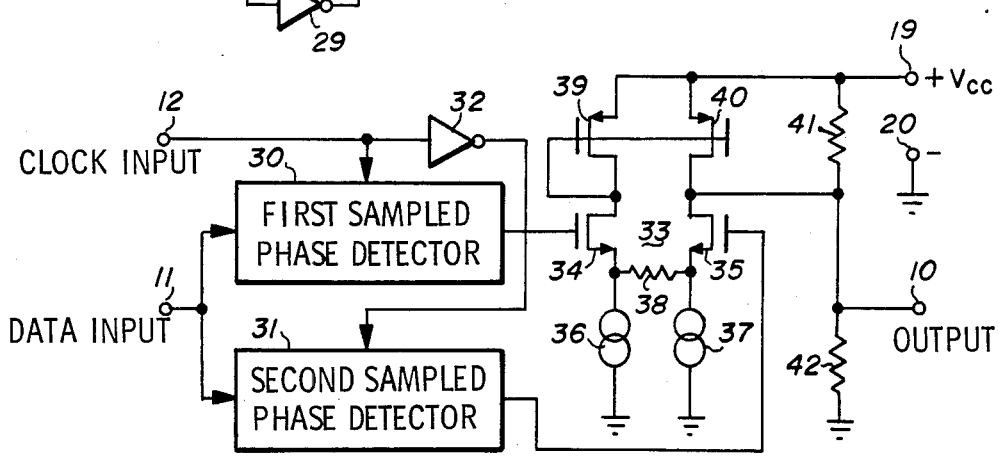
Fig_4

SAMPLED DATA AMPLITUDE LINEAR PHASE DETECTOR

BACKGROUND OF THE INVENTION

The invention relates to a phase detector of the kind useful in phase lock loop (FLL) applications. Usually digital phase detectors are fed signals that are large with respect to the input noise so that noise performance is not significant. However, in many applications it has been found that responding to a signal that is accompanied by noise is required. In this instance it is desirable for the phase detector to respond in a linear fashion to the input signal amplitude. Thus, the phase detector output has an amplitude that is related to the input signal level as well as its phase with respect to a local clock signal.

The typical digital phase detector circuits provide performance that is dependent upon the type of circuit employed. The MM74HC4046 (formerly CD4046) is a commercially available CMOS phase lock loop IC. It includes a VCO and a phase detector and is intended for inclusion in a system where it is desired to lock a locally generated signal to an incoming signal at any frequency up to about 20 MHz. Since the performance of the phase detector is strongly dependent upon the kind of phase detector employed three different kinds are provided in the IC with the desired one user determined. The first phase detector is simply an XOR gate. It has the disadvantage of being susceptible to harmonic signal locking. The second phase detector is an edge sensitive digital sequential network that includes a three state output. This kind of phase detector is less likely to lock on harmonics, but is more noise sensitive. The third phase detector is an SR flip-flop gate and performs in a manner similar to that of the first phase detector. Typically, the user connects the desired detector to an external network that includes the PLL low pass filter that feeds the VCO.

SUMMARY OF THE INVENTION

It is an object of the invention to provide a sampled data circuit that performs as a phase detector having a linear signal response.

It is a further object of the invention to employ a differential amplifier (diff amp) having a negative feedback capacitor and an input coupling capacitor and to apply a clocked switching system to the capacitors so that the amplifier output is a half wave rectified version of the input when the input is in phase with the clock and the d-c output component is related to the phase of the input with respect to the clock.

It is a still further object of the invention to employ a pair of sampled data circuits each one providing alternate half cycle half wave rectification in a combination that provides full wave rectification.

These and other objects are achieved as follows. A diff amp has its noninverting input returned to a source of reference voltage. The inverting input is coupled via a first capacitor to the output and via a second capacitor to the signal input switch. The signal input switch is operated by a clock signal and periodically switches the input capacitor between ground and the circuit input terminal. A second switch periodically shorts out the first capacitor during the reference interval when the second capacitor is grounded. Since the input capacitor is returned to ground during the reference interval, the output of the diff amp is at $V_{REF}$. Then, during the alternate half of the clock cycle, the diff amp gain is determined by the ratio of the two capacitors. This ratio is kept small with respect to the amplifier open loop gain so that the feedback conditions dominate performance. The diff amp d-c output component is a function of the phase difference between the data signal and the clock signal. Since a phase detector is normally followed by a low pass filter the d-c output is the significant parameter. Unlike most digital phase detectors the circuit responds linearly to the data signal. This means that in applications where noise is present, along with the data signal, the phase detector will preserve the signal to noise ratio so that the following low pass filter can discriminate against noise response. Since most digital circuits operate on a pulse edge they are quite susceptible to noise impulses.

Functionally the above-described sampled phase detector operates as a half wave rectifier when the data is in phase with the clock. The d-c output component is at $V_{REF}$ when the data and clock signals are in quadrature. When the clock and data signals are in phase, the average or d-c output is below $V_{REF}$ by an amount related to the data signal amplitude. When the data and clock signals are out of phase the average or d-c output rises above $V_{REF}$ by an amount related to the amplitude of the data signal. The output is a linear response to the phase difference from the inphase condition to the out of phase condition.

A full wave rectifier version of the circuit can be constructed as follows. Two of the above-described sampled phase detectors are coupled to the data input. One is clocked directly and the other is clocked through an inverter. The outputs are combined subtractively in a diff amp the output of which represents a full wave rectification of the data signal. This action doubles the output frequency so that the following low pass filter may have a higher cutoff frequency. This will permit a more rapid system response to phase shifts.

BRIEF DESCRIPTION OF THE DRAWING

FIG. 1 is a block diagram of the circuit of the invention.

FIG. 2 is a graph showing the operation of the circuit of FIG. 1.

FIG. 3 is a schematic diagram of a CMOS version of the circuit of the invention.

FIG. 4 is a schematic-block diagram of a full wave version of the circuit of the invention.

DESCRIPTION OF THE INVENTION

FIG. 1 is a block diagram of the circuit of the invention. The output at terminal 10 is a linear function of the data input at terminal 11. A clock input at 12 supplies the detector with a switching signal that operates switches 13 and 14. The heart of the circuit is differential amplifier (diff-amp) 15. The noninverting input is returned to a source of reference potential $V_{REF}$. A capacitor 16 is coupled between output terminal 10 and the inverting input. A second capacitor 17 couples the inverting input to switch 13. Switch 14 is coupled across capacitor 16 and operated in synchronism with switch 13.

When the clock input closes switch 14 capacitor 16 will be shorted out and discharged. Diff-amp 15 will force the inverting input to the level of $V_{REF}$. Capacitor 17, which has its left hand terminal grounded through switch 13, will be charged to $V_{REF}$. This clock phase sets up the reference operating conditions in the circuit.

When the clock phase switches, switch 14 will go open and switch 13 couples capacitor 17 to input terminal 11. In this state the circuit acts as a linear inverting amplifier with a gain of $C_{17}/C_{16}$.

FIG. 2 is a graph showing the waveforms associated with the operation of the FIG. 1 circuit. Waveform A represents the clock phase that operates switches 13 and 14. Waveform B represents the inphase data input signal. The data signal waveform B is shown as a sine wave because it may depart from the ideal digital wave shape. While not shown it may be embedded in noise and may be relatively low amplitude. Waveform C represents the circuit output at terminal 10 for the reception of waveform B. Note that for the inphase condition the output is related to the positive input half cycles and has an average d-c component below $V_{REF}$.

It is to be understood that while not shown, the detector of FIG. 1 is normally followed by a low pass filter that will pass the average value of the d-c voltage at terminal 10.

Waveform D represents the out of phase condition (180°). Here the circuit produces waveform E. The output is related to the negative input half cycles and has an average d-c component above $V_{REF}$.

Waveform F represents the quadrature phase condition (90°). This produces the output Waveform G which has an average value equal to $V_{REF}$ because the upward excursions match the downward excursions. After filtering these excursions cancel.

From the above it can be seen that the d-c output at terminal 10 will be a function of the relative phase of the clock and data signal at terminal 11. The output will also be linearly related to the amplitude of the data signal.

FIG. 3 is a schematic diagram of a CMOS version of the circuit of FIG. 1. The circuit operates from a $V_{CC}$ power supply coupled + to terminal 19 and − to ground terminal 20.

Diff amp 15 is composed of differentially connected N channel transistors 21 and 22, the tail current of which is established by current sink 23. P channel transistors 24 and 25 form a current mirror load for transistors 21 and 22 to provide a single-ended output at terminal 10.

Resistors 26 and 27 form a voltage divider that develops a $V_{REF}$ that is a controlled fraction of $V_{CC}$. A convenient value is achieved when resistor 27 is twice the value of resistor 26. For this condition $V_{REF} = \frac{2}{3} V_{CC}$.

P channel transistor 28 is connected across capacitor 16 to provide the function of switch 14 of FIG. 1. This switch will be closed when the clock at terminal 12 is low. For this clock state inverter 29 will turn N channel transistor 30 on which returns capacitor 17 to ground. When the clock input goes high transistor 28 is turned off and inverter 29 will turn transistor 30 off. The clock high directly turns N channel transistor 31 on thereby coupling capacitor 17 to data input terminal 11. Thus, transistors 30 and 31 in conjunction with inverter 29 form a SPDT switch function responsive to the clock signal.

The circuits of FIGS. 1 and 3 function as half wave rectifiers and their dominant output frequency is equal to the clock frequency. FIG. 4 shows a full wave rectifier structure having a dominant output frequency of twice the clock frequency. Such an output is more easily filtered; or, for the same degree of filtering, can change state at twice the rate so that a faster acting detector function is available.

FIG. 4 is a combination block diagram and schematic that shows a full wave version of the circuit of the invention. A first sampled phase detector 30 is a reproduction of the circuit of FIG. 3. A second commonly fed sampled phase detector 31 is identical to 30, but is operated by a complemented clock signal by inverter 32. The two detector outputs are combined in diff amp 33 which provides a combined output at terminal 10. The first sampled phase detector 30 drives the noninverting input to diff-amp 33 while the second sampled phase detector drives the inverting input. Since the clock complement is fed to the second sampled phase detector 31 its output will be inverted with respect to that of 30 and will respond to the input signal in the intervals between those of detector 30, which represent the sampling intervals. Since diff-amp 33 subtracts the output of 31 from that of 30, the inversion is offset and the combined outputs will be a full wave rectified version of the input signal when in phase with the clock.

Diff-amp 33 is made up of N channel input transistors 34 and 35 respectively current biased by sinks 36 and 37. Resistor 38 couples the sources of transistors 34 and 35. P channel transistors 39 and 40 are connected as a current mirror load to provide a single ended output at terminal 10. Resistors 41 and 42 provide a fraction of $V_{CC}$ to establish a $V_{REF}$ output level equal to that produced by resistors 26 and 27 of FIG. 3.

EXAMPLE

The circuit of FIG. 3 was constructed using conventional p well CMOS parts. The following components were employed:

| Part | Value | Units |
| --- | --- | --- |
| Capacitor 16 | 3 | picofarads |
| Capacitor 17 | 10 | picofarads |
| Current Sink 23 | 20 | microamperes |
| Resistor 26 | 100 | k ohms |
| Resistor 27 | 200 | k ohms |
| The following transistor sizes were employed: | | |
| Transistor | W/L (microns) | |
| 21, 22 | 250/8 | |
| 24, 25 | 150/10 | |
| 28 | 20/5 | |
| 30, 31 | 15/5 | |

The circuit was operated at a clock rate of 100 kHz and an amplitude of 5 volts for a logic one (zero volts for a logic zero). The $V_{CC}$ power supply was 5 volts. With a 0.25 volt peak data signal the average d-c output was at $V_{REF}$ for a quadrature phase relationship. The average d-c output varied linearly over a 0.5 volt range from the inphase to 180° phase relationship. The average d-c output varied linearly with the amplitude of the data signal down to a level of 10 millivolts.

The invention has been described and an operating example detailed. When a person skilled in the art reads the foregoing description, alternatives and equivalents, within the spirit and intent of the invention, will be apparent. For example, while a CMOS preferred embodiment is set forth, other circuit forms, such as NMOS or bipolar, can be employed. Accordingly, it is intended that the scope of the invention be limited only by the following claims.

I claim:

1. A sampled data phase detector circuit having a data input terminal connectible to a data signal, a clock input terminal connectible to a clock input signal, and an output terminal, said circuit comprising:
   a differential amplifier having inverting and noninverting inputs and an output that comprises said circuit output terminal;
   means for coupling a reference potential to said differential amplifier noninverting input;
   first capacitor means coupled between said differential amplifier output and inverting input;
   first switch means coupled across said first capacitor means and operated from said clock input terminal whereby said first capacitor means is periodically discharged and said differential amplifier inverting input is forced to said reference potential;
   second switch means having a single pole double throw operation with the pole thereof being actuated in response to the signal at said clock input terminal to switch between first and second positions, said first position being coupled to said circuit data input terminal and said second position being coupled to ground; and
   second capacitor means coupled between said second switch means pole and said differential amplifier inverting input whereby said differential amplifier output terminal develops a d-c voltage that is proportional to the phase difference between said data signal and said clock signal.

2. The circuit of claim 1 wherein the ratio of said second capacitor means to said first capacitor means is selected to determine the voltage gain of said detector circuit.

3. The circuit of claim 1 in further combination with a second identical sampled data phase detector circuit wherein said second circuit is provided with the complement of the clock signal and the outputs of the two circuits are subtractively combined whereby a full wave sampled data phase detector circuit is created.

4. The circuit of claim 3 wherein said subtractive combination is achieved with a differential combining amplifier and said second circuit output is coupled to the inverting input of said differential combining amplifier.

* * * * *